United States Patent
Cho et al.

(10) Patent No.: US 9,252,316 B2
(45) Date of Patent: Feb. 2, 2016

(54) ULTRA THIN HIT SOLAR CELL AND FABRICATING METHOD OF THE SAME

(71) Applicant: KOREA INSTITUTE OF ENERGY RESEARCH, Daejeon (KR)

(72) Inventors: Jun Sik Cho, Daejeon (KR); Jin Su Yoo, Seoul (KR); Joo Hyung Park, Daejeon (KR); Jae Ho Yun, Daejeon (KR); Jihye Gwak, Daejeon (KR); SeoungKyu Ahn, Daejeon (KR); Young Joo Eo, Daejeon (KR); SeJin Ahn, Daejeon (KR); Ara Cho, Seoul (KR); Kihwan Kim, Daejeon (KR); Kyung Hoon Yoon, Daejeon (KR); Kee Shik Shin, Daejeon (KR)

(73) Assignee: KOREA INSTITUTE OF ENERGY RESEARCH (KR)

( * ) Notice: Subject to any disclaimer, the term of this patent is extended or adjusted under 35 U.S.C. 154(b) by 0 days.

(21) Appl. No.: 14/676,075

(22) Filed: Apr. 1, 2015

(65) Prior Publication Data
US 2015/0287868 A1    Oct. 8, 2015

(30) Foreign Application Priority Data
Apr. 2, 2014    (KR) .......................... 10-2014-0039432

(51) Int. Cl.
| | |
|---|---|
| H01L 31/0747 | (2012.01) |
| H01L 31/0224 | (2006.01) |
| H01L 31/18 | (2006.01) |
| H01L 31/0236 | (2006.01) |

(52) U.S. Cl.
CPC ...... *H01L 31/0747* (2013.01); *H01L 31/02366* (2013.01); *H01L 31/022483* (2013.01); *H01L 31/1804* (2013.01); *H01L 31/1868* (2013.01); *H01L 31/1884* (2013.01)

(58) Field of Classification Search
None
See application file for complete search history.

(56) References Cited

U.S. PATENT DOCUMENTS

| | | | |
|---|---|---|---|
| 2009/0151782 A1* | 6/2009 | Ko | H01L 31/022425 136/255 |
| 2013/0240031 A1* | 9/2013 | Shim | H01L 31/068 136/256 |

FOREIGN PATENT DOCUMENTS

| | | |
|---|---|---|
| JP | H08-508368 A | 9/1996 |
| JP | 2004-296776 A | 10/2004 |

OTHER PUBLICATIONS

"A study on wet Etching Technique of Crystalline Silicon wafer for High-Efficiency Hetero-junction solar cells"; Kim, 2013. 8; The Graduate School Sungkyunkwan University; 38 pages.

* cited by examiner

*Primary Examiner* — Seahvosh Nikmanesh
(74) *Attorney, Agent, or Firm* — Mark E. Bandy; Rankin, Hill & Clark LLP

(57) ABSTRACT

Disclosed is an ultra-thin HIT solar cell, including: an n- or p-type crystalline silicon substrate; an amorphous silicon emitter layer having a doping type different from that of the silicon substrate; and an intrinsic amorphous silicon passivation layer formed between the crystalline silicon substrate and the amorphous silicon emitter layer, wherein the HIT solar cell further includes a transparent conductive oxide layer made of ZnO on an upper surface thereof, and the surface of the crystalline silicon substrate is not textured but only the surface of the transparent conductive oxide layer is textured, and thereby a very thin crystalline silicon substrate can be used, ultimately achieving an ultra-thin HIT solar cell having a very low total thickness while maintaining light trapping capacity.

8 Claims, 9 Drawing Sheets

ULTRA THIN HIT SOLAR CELL AND FABRICATING METHOD OF THE SAME

This work was supported by the Global Frontier R&D Program on Center for Multiscale Energy System funded by the National Research Foundation under the Ministry of Science, ICT & Future, Korea (2011-0031567).

BACKGROUND OF THE INVENTION

1. Field of the Invention

The present invention relates to a HIT (Heterojunction with Intrinsic Thin layer) solar cell and a method of manufacturing the same and, more particularly, to an ultra-thin HIT solar cell and a method of manufacturing the same.

2. Description of the Related Art

Typically, a solar cell is a key element for photovoltaic power generation to directly convert solar light into electricity, and may be referred to a p-n junction diode.

In the course of converting solar light into electricity by a solar cell, solar light is incident on the p-n junction of the solar cell to produce electron-hole pairs, and electrons are moved to an n layer and holes are moved to a p layer by an electric field, so that photovoltaic power is generated in the p-n junction. As such, when a load or system is connected to both ends of the solar cell, an electric current may flow to thus produce electric power.

A solar cell is generally configured such that a p-type semiconductor layer is formed on an n-type silicon substrate. The p-type semiconductor layer is formed by doping of a p-type impurity. Thus, an n-type semiconductor layer is provided under the silicon substrate, and a p-type semiconductor layer is provided on the substrate, thus forming a p-n junction. The front and the back side of the silicon substrate are formed with metal electrodes to collect a small number of carriers (holes) and a large number of carriers (electrons) photoproduced by the p-n junction.

To develop such a solar cell, passivation properties of the surface of a silicon substrate are improved to thereby minimize the recombination rate of the small number of carriers, ultimately maximizing photovoltaic conversion efficiency of the solar cell.

Recently, HIT (Heterojunction with Intrinsic Thin layer) solar cells are being developed, wherein an amorphous silicon (a-Si) thin film having superior passivation properties and high electrical conductivity due to tunneling of carriers is disposed between a silicon substrate and an electrode, and an intrinsic amorphous silicon thin film is added between the silicon substrate and the amorphous silicon thin film, thus drastically increasing solar cell efficiency.

The HIT solar cell developed by Sanyo, Japan includes advantages of both amorphous silicon and monocrystalline silicon. The intrinsic amorphous silicon thin film is an amorphous silicon thin film layer close to the intrinsic state where the number of electrons and the number of holes are the same, thereby preventing recombination of electrons and holes due to interfacial defects between the crystalline silicon substrate and the amorphous silicon thin film.

In the HIT solar cell, a p-n junction may be formed by a high bandgap (about 1.7 eV) of a-Si (amorphous Si:H) containing hydrogen, resulting in high voltage. Recombination of charges may be decreased due to a high passivation effect by hydrogen passivation of a-Si:H, and both the front and the back side of the cell may absorb light, thus ensuring a high-efficiency solar cell. Furthermore, this solar cell is adapted for fabrication of an ultra-thin solar cell that is recently receiving attention.

Recently, a solar cell is intended to diffuse incident light through surface texturing to increase the usage efficiency of incident solar light. A HIT solar cell is increased in light trapping capacity through surface texturing.

FIG. 11 illustrates a typical HIT solar cell.

As in a typical crystalline silicon solar cell, a currently available HIT solar cell is configured such that both surfaces of an n-type crystalline silicon substrate 10 are wet etched or dry etched so as to be textured, intrinsic a-Si:H passivation layers 21, 22 are formed on the both surfaces, a p-type a-Si:H layer 31 and an n-type a-Si:H layer 32 are formed on the passivation layers 21, 22, transparent conductive oxide (TCO) layers 41, 42 comprising indium tin oxide (ITO) are formed thereon, and then an upper electrode 50 and a lower electrode 60 are formed thereon.

The HIT solar cell is advantageous because the technically advanced surface texturing technique of crystalline silicon may be applied, and the amorphous silicon layer such as the passivation layer is a very thin film and thus a total surface texture of the HIT solar cell may be formed through surface texturing of the crystalline silicon substrate.

However, etching both surfaces of an expensive crystalline silicon substrate may increase the solar cell manufacturing cost, and environmental problems attributed to wastewater and toxic gases generated in the wet and dry etching processes may occur. The surface defects of the textured crystalline silicon substrate may cause an open voltage to decrease, and it is impossible to form a high-quality amorphous silicon thin film, thus lowering the efficiency of the solar cell.

In particular, the case where the crystalline silicon substrate is subjected to texturing is unsuitable for the fabrication of ultra-thin HIT solar cells because a thick substrate is required due to the etching of the crystalline silicon substrate in the surface texturing process.

Accordingly, many attempts have been made to reduce the degree of surface etching and surface defects using an improved technique for etching a crystalline silicon substrate, but limitations are imposed on increasing the performance of the HIT solar cell.

PRIOR ART

"A study on wet etching technique of crystalline silicon wafer for high-efficiency hetero-junction solar cells", KIM, Sun-Yong, Thesis (MA)—School of Photovoltaic System Engineering, Sungkyunkwan University, 2013. 8

SUMMARY OF THE INVENTION

Accordingly, the present invention has been made keeping in mind the above problems encountered in the related art, and an object of the present invention is to provide an ultra-thin HIT solar cell and a method of manufacturing the same.

In order to accomplish the above object, the present invention provides an ultra-thin HIT solar cell, comprising: an n- or p-type crystalline silicon substrate; an amorphous silicon emitter layer having a doping type different from that of the silicon substrate; and an intrinsic amorphous silicon passivation layer formed between the crystalline silicon substrate and the amorphous silicon emitter layer, wherein the HIT solar cell further comprises a transparent conductive oxide layer made of ZnO on an upper surface thereof, and only the surface of the transparent conductive oxide layer is textured.

Such an ultra-thin HIT solar cell is configured such that the surface of the crystalline silicon substrate is not textured but only the surface of the transparent conductive oxide layer is textured, thus enabling the use of a very thin crystalline silicon substrate, ultimately resulting in an ultra-thin HIT solar cell where the total thickness of the solar cell is very low.

As such, the ultra-thin HIT solar cell may further comprise an amorphous silicon back surface field layer formed opposite the amorphous silicon emitter layer and having the same doping type as that of the silicon substrate, and an intrinsic amorphous silicon passivation layer formed between the amorphous silicon back surface field layer and the crystalline silicon substrate.

Furthermore, the HIT solar cell may be provided in the form of a double-sided configuration where a lower transparent conductive oxide layer comprising ZnO is formed on the lower surface of the HIT solar cell, and the surface of the lower transparent conductive oxide layer is preferably textured.

Although the HIT solar cell may include a conventional crystalline silicon substrate having a thickness of 120 μm or more suitable for use in mass production, there is no need to form a surface texture on the crystalline silicon substrate, and thus a crystalline silicon substrate having a thickness of 100 μm or less may be used, resulting in an ultra-thin solar cell having a total thickness of not exceeding 130 μm. Currently, an ultra-thin HIT solar cell has been developed at lab scale, but such a HIT solar cell is unsuitable for mass production and also for practical use as it has no surface texture and exhibits poor light trapping capacity. Whereas, since the ultra-thin HIT solar cell according to the present invention is very thin and has a surface texture to thus exhibit superior light trapping capacity, it may be practically used and is adapted for mass production.

In addition, the present invention provides a method of manufacturing an ultra-thin HIT solar cell, comprising: preparing an n- or p-type crystalline silicon substrate; forming an intrinsic amorphous silicon passivation layer on the upper surface of the crystalline silicon substrate; forming an amorphous silicon emitter layer having a doping type different from that of the silicon substrate on the upper surface of the passivation layer; and forming a transparent conductive oxide layer with ZnO on the upper surface of the amorphous silicon layer, wherein the surface of the crystalline silicon substrate is not textured upon preparing the crystalline silicon substrate, and only the surface of the transparent conductive oxide layer is textured upon forming the transparent conductive oxide layer.

In addition, the present invention provides a method of manufacturing an ultra-thin HIT solar cell, comprising: preparing an n- or p-type crystalline silicon substrate; forming an intrinsic amorphous silicon passivation layer on each of both surfaces of the crystalline silicon substrate; forming an amorphous silicon emitter layer having a doping type different from that of the silicon substrate on a surface of one intrinsic amorphous silicon passivation layer, and forming an amorphous silicon back surface field layer having the same doping type as that of the silicon substrate on a surface of the other intrinsic amorphous silicon passivation layer; and forming a transparent conductive oxide layer with ZnO on a surface of either the amorphous silicon emitter layer or the amorphous silicon back surface field layer, wherein the surface of the crystalline silicon substrate is not textured upon preparing the crystalline silicon substrate, and only the surface of the transparent conductive oxide layer is textured upon forming the transparent conductive oxide layer.

As such, the method may further comprise forming a lower transparent conductive oxide layer with ZnO on a surface of the amorphous silicon emitter layer or the amorphous silicon back surface field layer, on which the transparent conductive oxide layer was not formed, thereby manufacturing a double-sided HIT solar cell. Forming the lower transparent conductive oxide layer may be carried out in the same manner as forming the transparent conductive oxide layer, so that the surface of the lower transparent conductive oxide layer is textured.

Also, forming the transparent conductive oxide layer may be performed by forming a boron (B)-doped ZnO (ZnO:B, BZO) thin film using a low pressure chemical vapor deposition (LPCVD) process. The LPCVD process may be performed using a ZnO source gas at a flow rate of 100~200 sccm and a B-containing doping gas at a flow rate of 30 sccm or less, under the conditions of a deposition pressure of 0.1~300 Torr, and a deposition substrate temperature of room temperature 500° C., and thereby the surface of the BZO transparent conductive oxide layer may be textured, without the need for an additional process.

Alternatively, forming the transparent conductive oxide layer may comprise depositing an aluminum (Al)- or gallium (Ga)-doped ZnO thin film and then texturing the surface of the ZnO thin film. As such, the Al- or Ga-doped ZnO thin film may be deposited using a sputtering process, and the surface texture may be formed by chemically etching the surface of the ZnO thin film using an acid solution or an alkali solution.

According to the present invention, a very thin crystalline silicon substrate can be used because the surface of a crystalline silicon substrate is not textured but only the surface of a transparent conductive oxide layer is textured, resulting in an ultra-thin HIT solar cell having a very low total thickness while maintaining light trapping capacity.

Also, in the present invention, an expensive crystalline silicon substrate etching process can be obviated, thus reducing the manufacturing cost.

Also, in the present invention, since there are no problems with surface defects of the crystalline silicon substrate in a typical process for etching the surface of the crystalline silicon substrate, the efficiency of the solar cell can be increased.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF SPECIFIC EMBODIMENTS

Hereinafter, a detailed description will be given of embodiments of the present invention with reference to the appended drawings.

Figure 1:
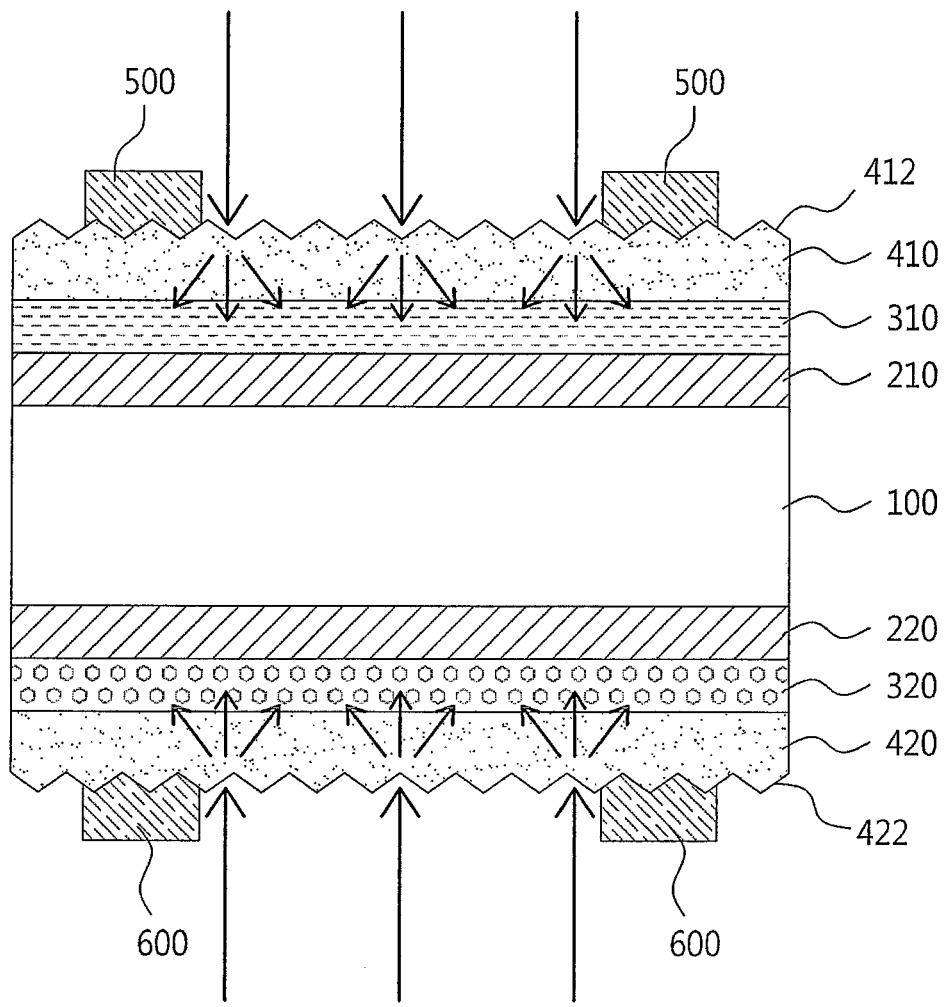
FIG. 1 illustrates the cross-section of an ultra-thin HIT solar cell according to an embodiment of the present invention.

FIG. 1 illustrates the cross-section of an ultra-thin HIT solar cell according to an embodiment of the present invention.

As illustrated in FIG. 1, the ultra-thin HIT solar cell is a double-sided HIT solar cell where solar light incident on both the upper and lower sides of the solar cells may be used for power generation.

In the present embodiment, the ultra-thin HIT solar cell is configured such that intrinsic amorphous silicon (a-Si:H) passivation layers 210, 220 are deposited on both sides of an n-type or p-type crystalline silicon substrate 100, an amorphous silicon emitter layer 310 having a doping type different from that of the crystalline silicon substrate 100 is formed thereon, and an amorphous silicon back surface field layer 320 having the same doping type as that of the crystalline silicon substrate 100 is formed thereunder. Specifically, when an n-type crystalline silicon substrate 100 having high efficiency is used, the amorphous silicon emitter layer 310 is made of p-type doped amorphous silicon (p-type a-Si:H), thus forming a p-n junction with the crystalline silicon substrate. The amorphous silicon back surface field layer 320 is made of n-type doped amorphous silicon (n-type a-Si:H) to thus form a back surface field (BSF). On the other hand, when a p-type crystalline silicon substrate 100 is used, the amorphous silicon emitter layer 310 is made of n-type doped amorphous silicon (n-type a-Si:H), and the amorphous silicon back surface field layer 320 is made of p-type doped amorphous silicon (p-type a-Si:H).

As illustrated in the drawing, the amorphous silicon emitter layer 310 and the amorphous silicon back surface field layer 320 are generally disposed at the upper position and the lower position, respectively, but the positions thereof are not fixed because light incident on both the upper and lower sides of the solar cell is used.

In the present embodiment, forming the crystalline silicon substrate 100 and the intrinsic amorphous silicon passivation layers 210, 220, and forming the amorphous silicon emitter layer 310 and the amorphous silicon back surface field layer 320 may be performed as in conventional methods, without particular limitation. In particular, since the crystalline silicon substrate 100 is not subjected to a surface texturing process in the present embodiment, the high-quality amorphous silicon thin film may be easily formed using the conventional process.

To prevent reflection, a transparent conductive oxide layer (TCO) 410 and a lower transparent conductive oxide layer 420 are formed on the outer surfaces of the amorphous silicon emitter layer 310 and the amorphous silicon back surface field layer 320, respectively, and uneven surface textures 412, 422 are formed on the surfaces of the transparent conductive oxide layer 410 and the lower transparent conductive oxide layer 420. In the present embodiment, the transparent conductive oxide layer 410 and the lower transparent conductive oxide layer 420 are formed of a doped ZnO thin film, instead of typically useful ITO (indium tin oxide), and the doped ZnO thin film has low material cost and is appropriate for formation of a surface texture, compared to ITO. Forming the surface textures 412, 422 on the surfaces of the transparent conductive oxide layer 410 and the lower transparent conductive oxide layer 420 is described later.

Further, an upper electrode 500 and a lower electrode 600 are formed on the transparent conductive oxide layer 410 and the lower transparent conductive oxide layer 420, respectively. In the present embodiment, the solar cell is a double-sided HIT solar cell configured such that both the upper electrode 500 and the lower electrode 600 are provided in a grid form so that solar light incident from the bottom may be used for power generation.

Below is a description of two methods for forming the transparent conductive oxide layer and the lower transparent conductive oxide layer according to the present embodiment.

The first method for forming the transparent conductive oxide layer and the lower transparent conductive oxide layer is that a B-doped ZnO (ZnO:B; BZO) thin film is formed using an LPCVD process.

LPCVD, which is a chemical vapor deposition process including an atmospheric pressure chemical vapor deposition (APCVD) process, is performed at relatively low pressure in such a manner that gaseous feeds are introduced and a reaction product thereof is accumulated to form a thin film. To form a BZO thin film, a Zn source gas may include any one gas selected from among $(C_2H_5)_2Zn$ (Diethylzinc; DEZ), $(CH_3)_2Zn$ (Dimethylzinc; DMZ), and $Zn(C_5H_7O_2)_2$ (Zinc acetyl-acetonate), and an O source gas may include any one gas selected from among $H_2O$, $O_2$, $N_2O$, $CO_2$, and alcohol. Further, a B doping gas may include $B_2H_6$ diluted with $H_2$ or Ar gas. The aforementioned source and doping gases are merely illustrative, but the present invention is not limited thereto. A carrier gas for transporting the source gases and the doping gas may include, but is not limited to, Ar gas or $N_2$ gas, and the source gas may be directly used as a carrier gas.

In the present embodiment, LPCVD for forming a BZO thin film may be performed under the conditions of a deposition pressure of 0.1~300 Torr and a deposition substrate temperature of room temperature ~500° C. Also, while the diluted doping gas is allowed to flow at a rate of 30 sccm or less, the deposition process is implemented, thereby forming a BZO thin film having a thickness of about 0.3~10 μm.

Figure 2:
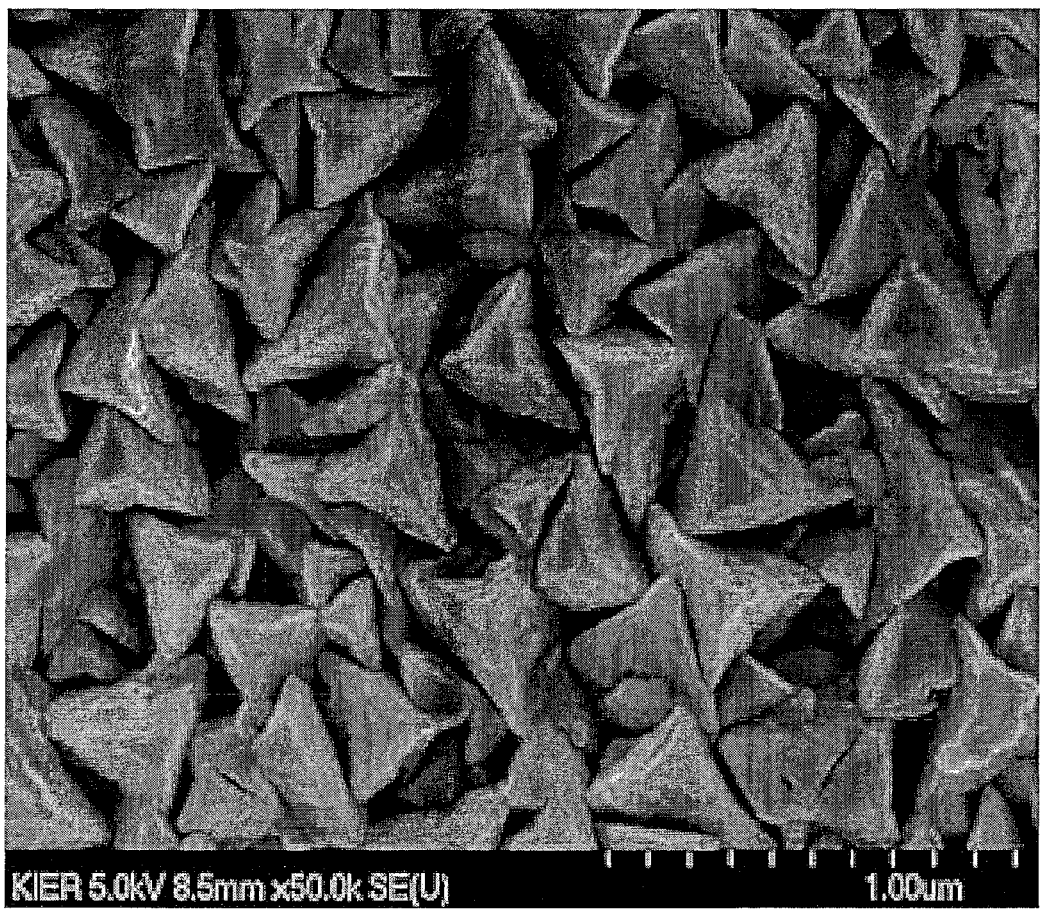
FIG. 2 illustrates a scanning electron microscope (SEM) image of the surface of a BZO transparent conductive oxide layer deposited using an LPCVD process according to an embodiment of the present invention.
Figure 3:
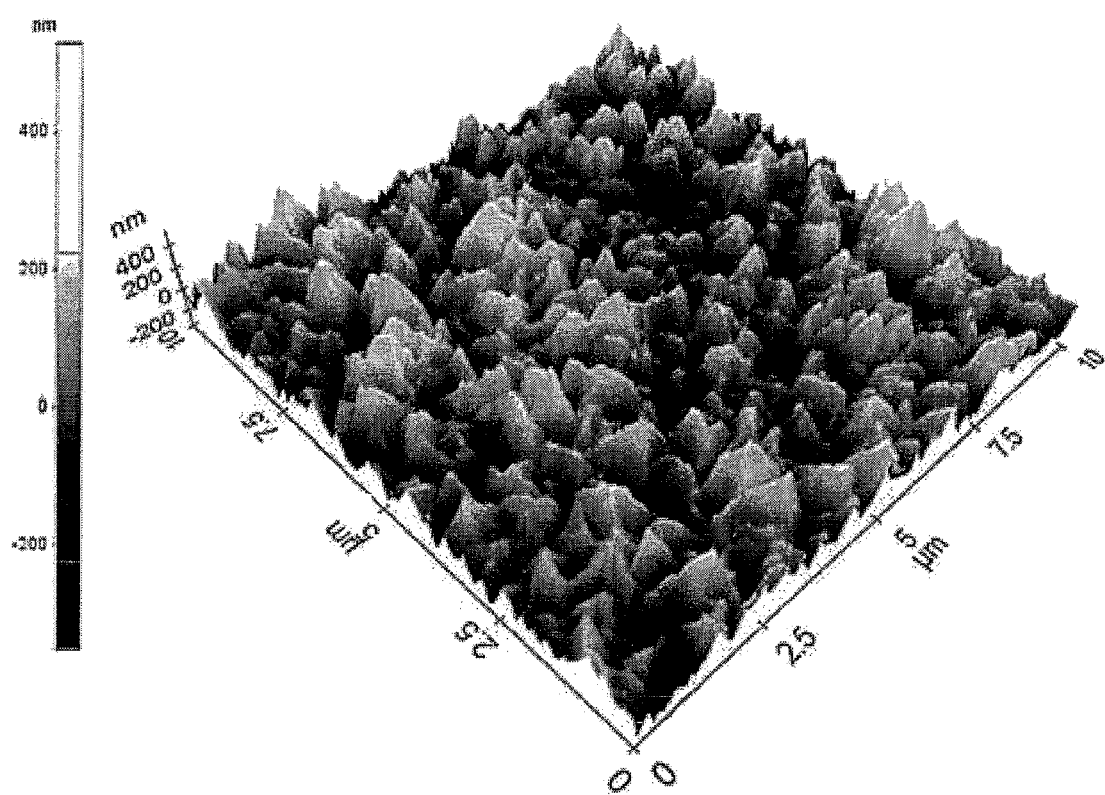
FIG. 3 illustrates an atomic force microscope (AFM) image of the BZO transparent conductive oxide layer deposited using an LPCVD process according to an embodiment of the present invention.

FIGS. 2 and 3 are SEM and AFM images illustrating the surface of the BZO transparent conductive oxide layer deposited using an LPCVD process according to the present embodiment.

In the present embodiment, the BZO thin film is formed using $(CH_2H_5)_2Zn$ as a Zn source gas and $H_2O$ as an O source gas, with the use of 1% diluted $B_2H_6$ gas as a B doping gas. The inner pressure of a chamber where the deposition is carried out is 5 Torr, the deposition substrate temperature is 120° C., the pressure of DEZ and $H_2O$ canister is 200 Torr, and the flow rate of Ar gas as a carrier gas is adjusted in the range of 100~200 sccm. The 0.1% diluted $B_2H_6$ doping gas is allowed to flow at a rate of 0.3 sccm, thereby forming a BZO thin film having a thickness of about 3 μm.

As illustrated in FIG. 2, the surface of the BZO transparent conductive oxide layer deposited using LPCVD under the above deposition conditions is uneven. In particular, as seen in the AFM image of FIG. 3, the surface of the BZO transparent conductive oxide layer according to the present embodiment is textured with pointed protrusions, rather than being simply uneven. When the BZO thin film is formed using LPCVD under the conditions of the present embodiment, the surface of the transparent conductive oxide layer may be textured even without the use of an additional process, thus increasing process efficiency.

Figure 4:
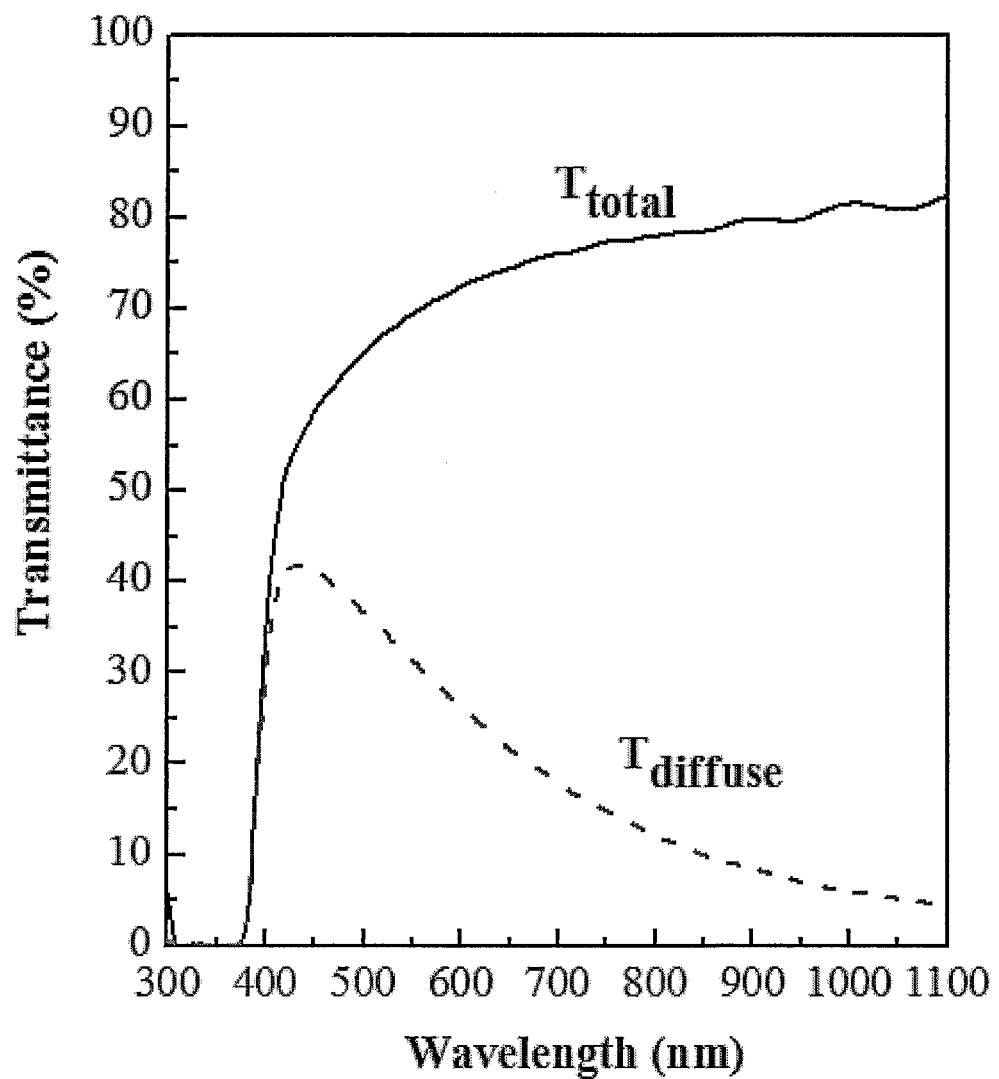
FIG. 4 illustrates the results of measurement of transmittance of the BZO transparent conductive oxide layer deposited using an LPCVD process according to an embodiment of the present invention.

FIG. 4 illustrates the results of measurement of transmittance of the BZO transparent conductive oxide layer deposited using LPCVD according to the present embodiment.

FIG. 4 illustrates the results of measurement of total transmittance ($T_{total}$) and diffuse transmittance ($T_{diffuse}$) of the BZO thin film formed on an alkali-free glass substrate by LPCVD under the above conditions, depending on the wavelength range of light. From this, incident light can be seen to be diffused via a surface texture that is formed on the surface of the BZO transparent conductive oxide layer. Accordingly, sufficient light trapping effects may be obtained by the textured surface of the BZO transparent conductive oxide layer formed using LPCVD, without the formation of a surface texture of the crystalline silicon substrate.

The second method for forming the transparent conductive oxide layer and the lower transparent conductive oxide layer according to the present embodiment is that an Al- or Ga-doped ZnO thin film is formed using a deposition process and then texturing is performed on the surface of the ZnO thin film.

Specifically, the deposition process for forming the ZnO:Al or ZnO:Ga thin film may be exemplified by a sputtering process, such as DC sputtering or RF magnetron sputtering, an e-beam evaporation process, and a thermal evaporation process. Typical techniques for forming a ZnO thin film may be applied without limitation, and the thin film is formed so that the doping element such as Al or Ga is doped in an amount of 0.1~10 wt %. In particular, a sputtering process may be carried out under the conditions of a deposition pressure of 0.5~10 mTorr, a deposition temperature of room temperature ~500° C., and a deposition power density of 0.5~20 W/cm².

Figure 5:
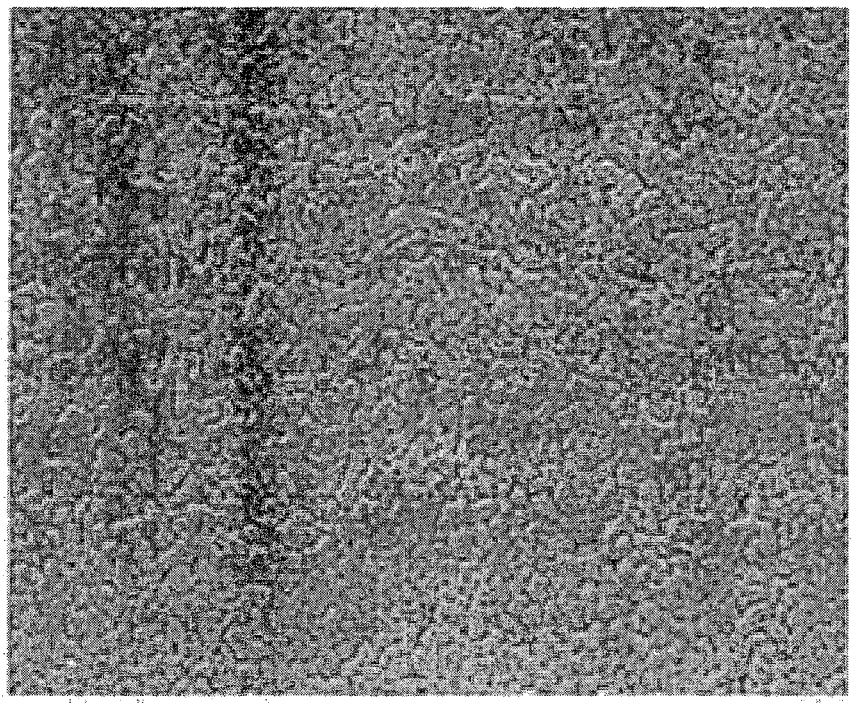
FIG. 5 illustrates an SEM image of the surface of a ZnO:Al transparent conductive oxide layer deposited using a sputtering process according to an embodiment of the present invention.

FIG. 5 illustrates an SEM image of the surface of the ZnO:Al transparent conductive oxide layer deposited using a sputtering process according to the present embodiment.

The ZnO:Al thin film is formed using a ZnO:Al single target including 1.5 wt % of $Al_2O_3$ by an RF magnetron sputtering device. As such, the ZnO:Al thin film having a thickness of about 1 μm is formed under the conditions of a deposition pressure of 1.5 mTorr, a deposition target temperature of 100° C., and a deposition power density of 1.5 W/cm².

As illustrated in FIG. 5, the thin film formed using a sputtering process has a flat surface, unlike the thin film formed using LPCVD as mentioned above. Since such a flat surface is obtained even by e-beam evaporation or thermal evaporation, forming a surface texture of the thin film is additionally conducted.

Texturing of the flat surface of the ZnO:Al or ZnO:Ga thin film may be performed by a chemical etching process using an acid or alkali solution. Specifically, when the surface of the ZnO:Al or ZnO:Ga thin film is etched using an acid solution containing 0.1~10% HCl or $H_2C_2O_4$ or an alkali solution, it is textured through uneven etching.

Figure 6:
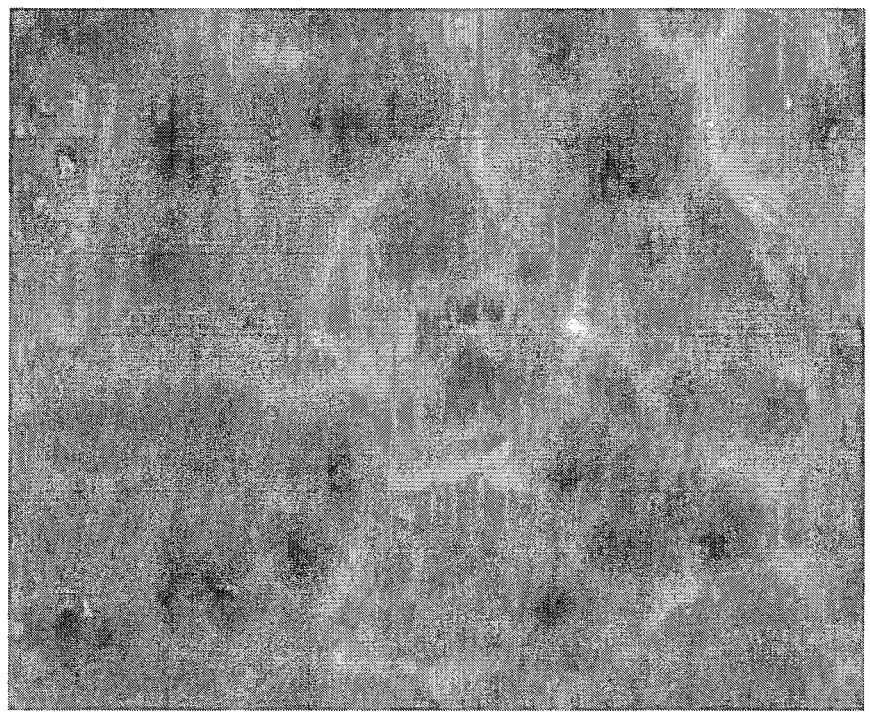
FIG. 6 illustrates an SEM image of the surface of the ZnO:Al transparent conductive oxide layer having a surface texture through etching after deposition using a sputtering process according to an embodiment of the present invention.

FIG. 6 illustrates an SEM image of the surface of the ZnO:Al transparent conductive oxide layer having a surface texture through etching after deposition using a sputtering process according to the present embodiment.

In the present embodiment, the surface of the ZnO:Al thin film formed under the above sputtering conditions is etched using a 0.5% HCl solution for 70 sec, thus forming a surface texture.

Unlike FIG. 5, FIG. 6 shows the surface roughness of the ZnO:Al thin film. The surface roughness is measured to be 6.8 nm before surface texturing, but is increased to 107 nm after surface texturing.

Figure 7:
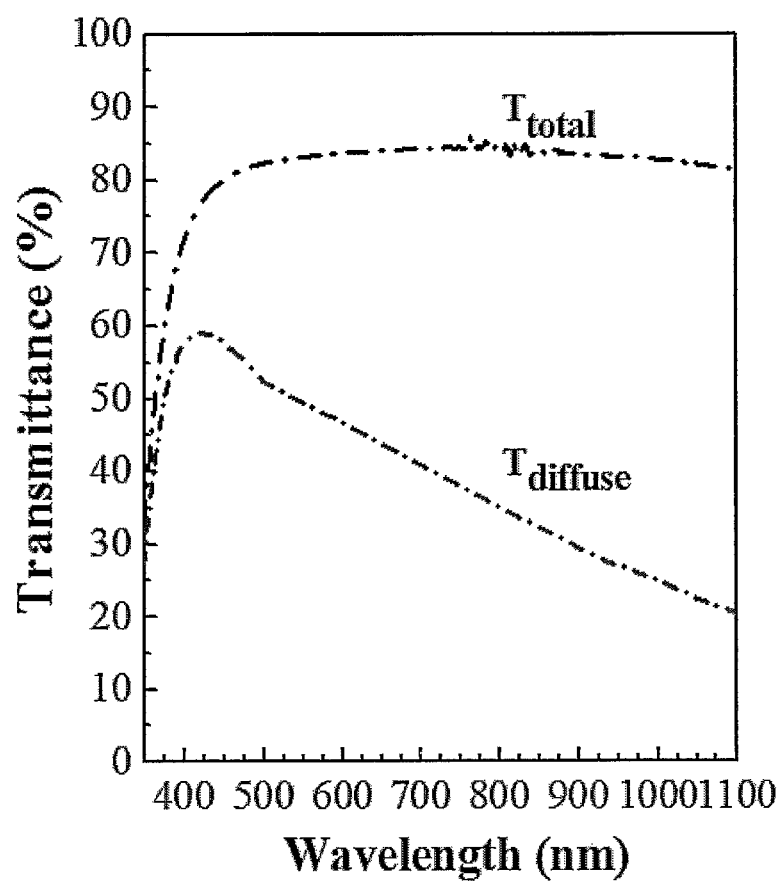
FIG. 7 illustrates the results of measurement of transmittance of the transparent conductive oxide layer formed using a sputtering process and a surface texturing process according to an embodiment of the present invention.

FIG. 7 illustrates the results of measurement of transmittance of the transparent conductive oxide layer resulting from a sputtering process and a surface texturing process according to the present embodiment.

FIG. 7 illustrates the results of measurement of total transmittance ($T_{total}$) and diffuse transmittance ($T_{diffuse}$) of the ZnO:Al thin film formed on a glass substrate by a surface texturing process after a sputtering process under the above conditions, depending on the wavelength range of light. From this, incident light is diffused by the ZnO:Al thin film subjected to surface texturing, and sufficient light trapping effects may be obtained by performing surface texturing on the transparent conductive oxide layer formed by a sputtering process, without the formation of a surface texture on the crystalline silicon substrate.

Figure 8:
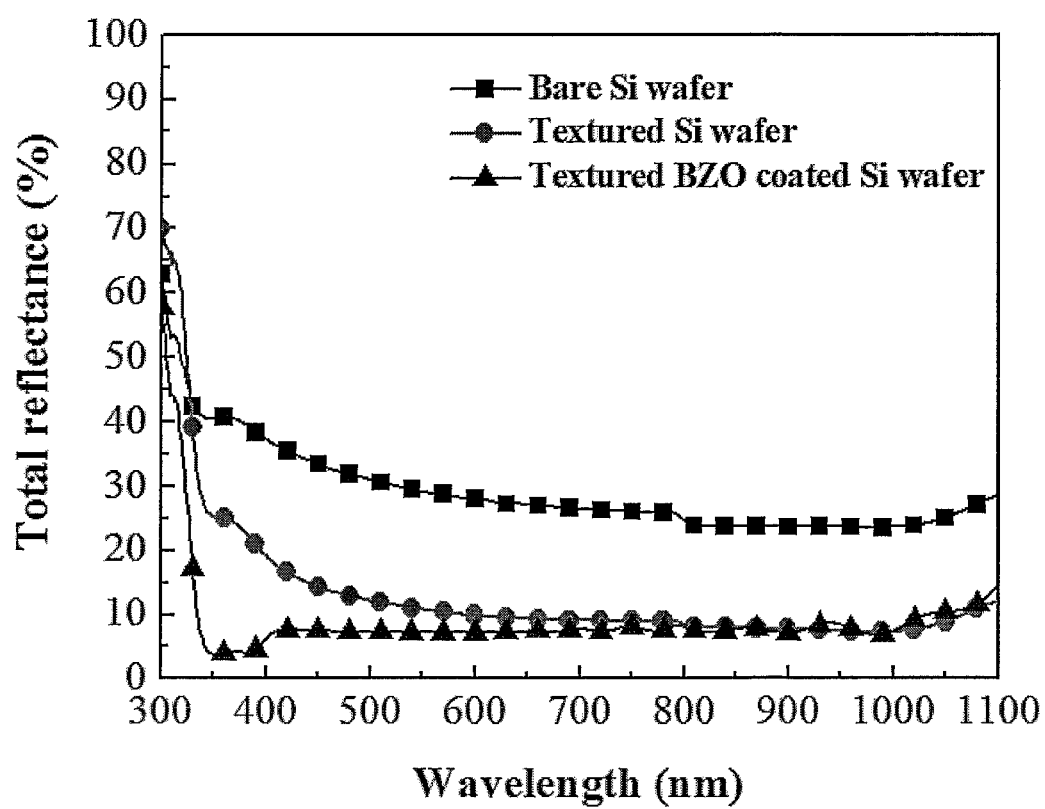
FIG. 8 illustrates the results of measurement of surface reflectance of various surfaces.

FIG. 8 illustrates the results of measurement of surface reflectance of various surfaces.

Specifically, crystalline silicon for a solar cell having a thickness of 120 μm is prepared, after which the surface reflectance is measured when surface texturing is not performed; when the surface of the crystalline silicon substrate is directly textured using chemical etching; and when the BZO transparent conductive oxide layer is formed on the surface of the crystalline silicon substrate using LPCVD according to the above embodiment.

The crystalline silicon substrate not subjected to surface texturing, as represented by black, shows a surface reflectance of about 30%, and thereby about 70% of incident solar light may be used for a photovoltaic power generation process. On the other hand, the crystalline silicon substrate, the surface of which is directly textured, as represented by red, has a reflectance of about 10%, so that about 90% of incident solar light may be used for a photovoltaic power generation process. This case is currently applied to HIT solar cells.

Also, the case where the surface of the crystalline silicon substrate is not subjected to surface texturing but is formed with the BZO thin film using LPCVD according to the present embodiment is represented by blue, and exhibits a reflectance of about 10% as in the case where the surface of silicon is directly textured. Consequently, even when the BZO transparent conductive oxide layer is formed using LPCVD according to the present embodiment, there is no difference in light trapping capacity from the case where the surface of the crystalline silicon substrate is directly subjected to texturing.

In the ultra-thin HIT solar cell according to the present embodiment as mentioned above, since the crystalline silicon substrate is not subjected to surface texturing, it may be directly applied to a process for forming an amorphous silicon passivation layer after a surface cleaning process. Hence, not only a crystalline silicon substrate having a thickness of 120~150 μm for use in mass production of solar cells but also a crystalline silicon substrate having a thickness of 100 μm or less may be employed. Furthermore, the thickness of the amorphous silicon passivation layer is about 3~20 nm, and the amorphous silicon emitter layer and the amorphous silicon back surface field layer are 5~30 nm thick and 5~30 nm thick, respectively. Also, the transparent conductive oxide layer has a thickness of 0.3~10 μm. Thus, the total thickness of the HIT solar cell does not exceed 150 μm, and therefore this structure is adapted for an ultra-thin HIT solar cell that is recently receiving attention. The HIT solar cell according to the present embodiment is ultra-thin and has a surface texture and can thus exhibit excellent light trapping capacity.

When the surface of a crystalline silicon substrate is directly subjected to texturing according to conventional techniques, the material cost may increase, and surface defects of the silicon substrate are significantly caused, thus lowering an open voltage, undesirably deteriorating the efficiency of the solar cell. Furthermore, it is difficult to form a high-quality amorphous silicon passivation layer on the damaged surface of the crystalline silicon substrate, undesirably resulting in lowered efficiency of HIT solar cells. However, the ultra-thin HIT solar cell according to the present embodiment may alleviate the above problems because the surface of the crystalline silicon substrate is not subjected to texturing, thereby increasing the efficiency of the HIT solar cell.

The embodiment of FIG. 1 shows a complicated double-sided structure, and relatively simple structures are described below.

Figure 9:
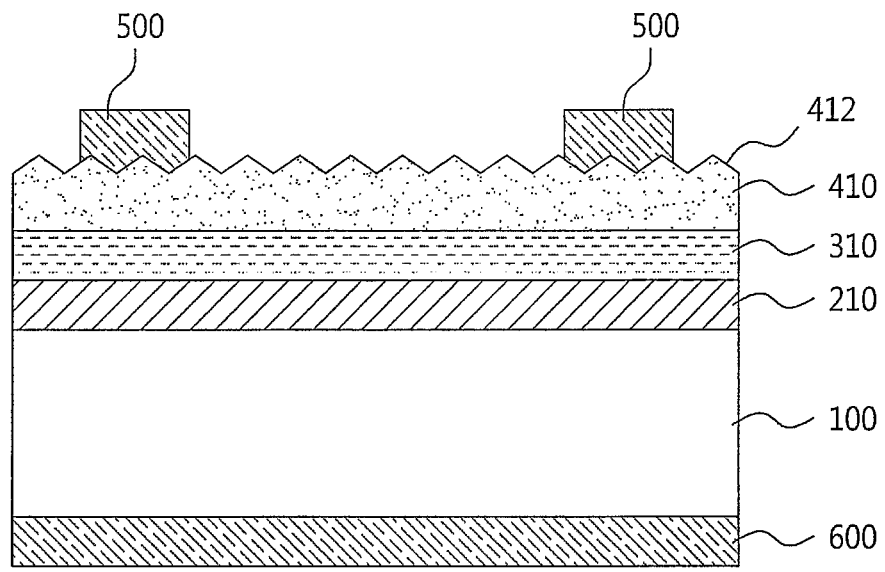
FIG. 9 illustrates the cross-section of an ultra-thin HIT solar cell according to another embodiment of the present invention.

FIG. 9 illustrates the cross-section of an ultra-thin HIT solar cell according to another embodiment of the present invention.

The HIT solar cell illustrated in FIG. 9 is a single-sided HIT solar cell using only solar light incident from the top, which is configured such that a lower transparent conductive oxide layer is not formed, and a lower electrode 600 is not provided in a grid form.

Further, an amorphous silicon back surface field layer is not provided, and thus an amorphous silicon passivation layer is not formed under the crystalline silicon substrate 100. Also, an n- or p-type crystalline silicon substrate 100 not subjected to surface texturing, an intrinsic amorphous silicon passivation layer 210 formed thereon, and an amorphous silicon emitter layer 310 having a doping type different from that of the crystalline silicon substrate 100 remain the same as in the above embodiment, and a detailed description thereof is omitted.

Also, a transparent conductive oxide layer 410 comprising ZnO is formed, and the surface texture 412 thereof is formed in the same manner as in the above embodiment and thus a description thereof is omitted.

Figure 10:
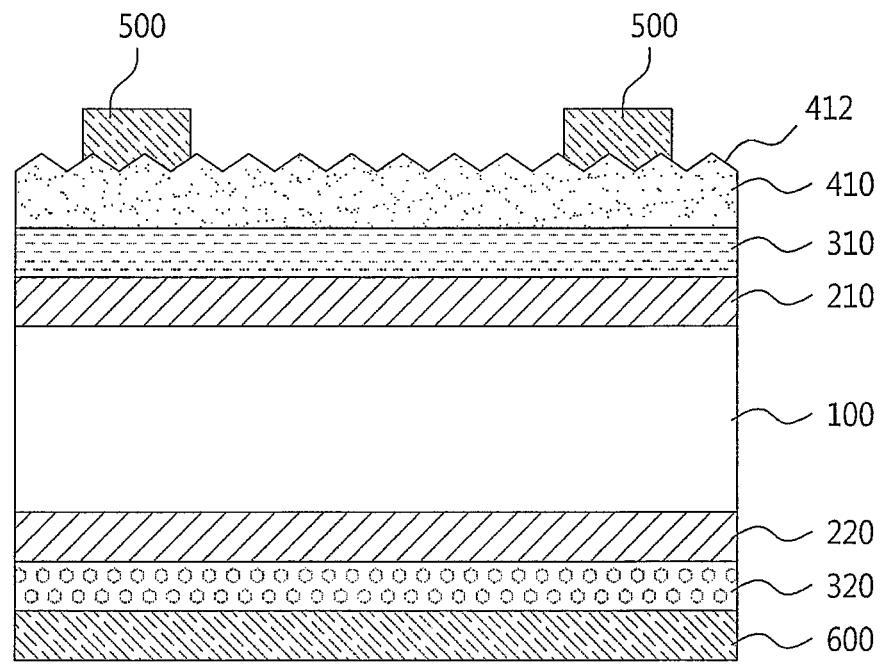
FIG. 10 illustrates the cross-section of an ultra-thin HIT solar cell according to a further embodiment of the present invention.
Figure 11:
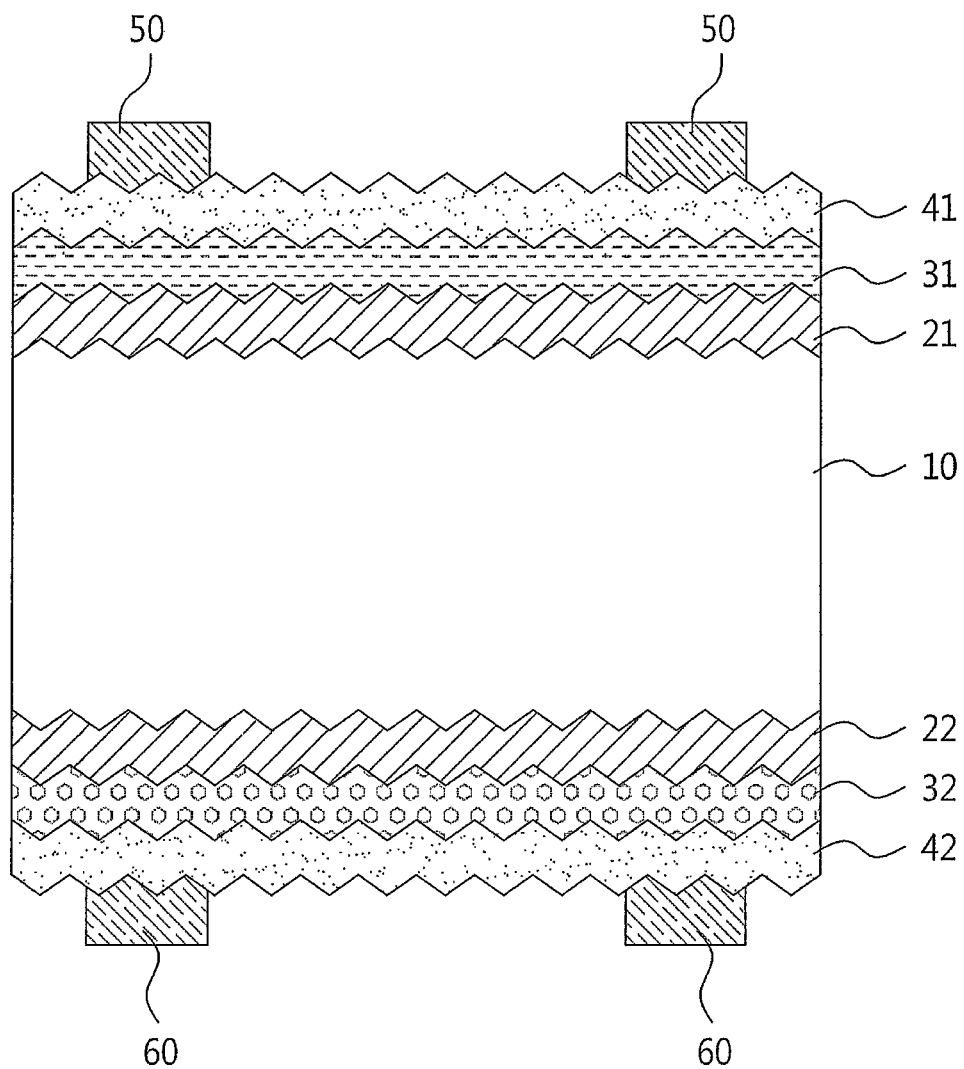
FIG. 11 illustrates a typical HIT solar cell.

FIG. 10 illustrates the cross-section of an ultra-thin HIT solar cell according to a further embodiment of the present invention.

The HIT solar cell illustrated in FIG. 10 is also a single-sided HIT solar cell using only solar light incident from the top, which is configured such that a lower transparent conductive oxide layer is not formed, and a lower electrode 600 is not provided in a grid form.

However, unlike the embodiment of FIG. 9, the embodiment of FIG. 10 includes an amorphous silicon back surface field layer 320. Hence, an amorphous silicon passivation layer 220 is formed under the crystalline silicon substrate 100 and then an amorphous silicon back surface field layer 320 having the same doping type as that of the crystalline silicon substrate 100 is formed thereunder. The positions of the amorphous silicon emitter layer 310 and the amorphous silicon back surface field layer 320 may be differently set, as in the first embodiment, and the n- or p-type crystalline silicon substrate 100 not subjected to surface texturing, and an intrinsic amorphous silicon passivation layer 210 and an amorphous silicon emitter layer 310 having a doping type different from that of the crystalline silicon substrate 100, which are formed thereon, remain the same as those described in the above embodiments, and thus a description thereof is omitted.

Also, a transparent conductive oxide layer 410 comprising ZnO is formed, and the surface texture 412 is formed thereon, which is the same as in the above embodiments, and a description thereof is omitted.

The present invention is a technique derived from the results of research (2011-0031578) as a global frontier R & D program of multi-scale energy system research group with the support of the National Research Foundation of Korea funded by MSIP (Ministry of Science, ICT and Future Planning).

Although the preferred embodiments of the present invention have been disclosed for illustrative purposes, those skilled in the art will appreciate that various modifications, additions and substitutions are possible, without departing from the scope and spirit of the invention as disclosed in the accompanying claims. Therefore, it will be understood that the scope of the present invention is determined not by specific embodiments but by the following claims.

What is claimed is:

1. A method of manufacturing an ultra-thin HIT solar cell, comprising:
preparing an n- or p-type crystalline silicon substrate;
forming an intrinsic amorphous silicon passivation layer on an upper surface of the crystalline silicon substrate;
forming an amorphous silicon emitter layer having a doping type different from that of the silicon substrate on an upper surface of the passivation layer; and
forming a transparent conductive oxide layer with ZnO on an upper surface of the amorphous silicon layer,
wherein a surface of the transparent conductive oxide layer is textured upon forming the transparent conductive oxide layer.

2. A method of manufacturing an ultra-thin HIT solar cell, comprising:
preparing an n- or p-type crystalline silicon substrate;
forming an intrinsic amorphous silicon passivation layer on each of both surfaces of the crystalline silicon substrate;
forming an amorphous silicon emitter layer having a doping type different from that of the silicon substrate on a surface of one intrinsic amorphous silicon passivation layer, and forming an amorphous silicon back surface field layer having the same doping type as that of the silicon substrate on a surface of the other intrinsic amorphous silicon passivation layer; and
forming a transparent conductive oxide layer with ZnO on a surface of either the amorphous silicon emitter layer or the amorphous silicon back surface field layer,
wherein a surface of the transparent conductive oxide layer is textured upon forming the transparent conductive oxide layer.

3. The method of claim 2, further comprising forming a lower transparent conductive oxide layer with ZnO on a surface of the amorphous silicon emitter layer or the amorphous silicon back surface field layer, on which the transparent conductive oxide layer was not formed, wherein forming the lower transparent conductive oxide layer is performed in the same manner as forming the transparent conductive oxide layer.

4. The method of claim 1, wherein forming the transparent conductive oxide layer is performed by forming a boron (B)-doped ZnO (ZnO:B, BZO) thin film using a low pressure chemical vapor deposition (LPCVD) process.

5. The method of claim 4, wherein the LPCVD process is performed using a ZnO source gas comprising $(CH_2H_5)_2Zn$ and $H_2O$ and using a B-containing doping gas comprising $B_2H_6$, under conditions of a deposition pressure of 0.1~300 Torr and a deposition substrate temperature of room temperature ~500° C.

6. The method of claim 1, wherein forming the transparent conductive oxide layer comprises depositing an aluminum (Al)- or gallium (Ga)-doped ZnO thin film and then texturing a surface of the ZnO thin film.

7. The method of claim 6, wherein depositing the Al- or Ga-doped ZnO thin film is performed using a sputtering process.

8. The method of claim 6, wherein texturing the surface of the ZnO thin film is performed by chemically etching the surface of the ZnO thin film using an acid solution or an alkali solution.

* * * * *